(12) United States Patent
Chen et al.

(10) Patent No.: US 10,608,675 B1
(45) Date of Patent: Mar. 31, 2020

(54) METHOD FOR PERFORMING POLAR DECODING WITH AID OF NOTATION TRANSFORMATION AND ASSOCIATED POLAR DECODER

(71) Applicant: MEDIATEK INC., Hsin-Chu (TW)

(72) Inventors: Wei-Yeu Chen, Hsinchu (TW); Tien-Shin Ho, Hsinchu (TW); Shao-Ping Hung, Hsinchu (TW); Chia-Wei Tai, Hsinchu (TW); Tien-Yu Lin, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 60 days.

(21) Appl. No.: 16/125,751

(22) Filed: Sep. 9, 2018

(51) Int. Cl.
  *H03M 13/37* (2006.01)
  *H03M 13/39* (2006.01)
  *H03M 13/13* (2006.01)

(52) U.S. Cl.
  CPC ........... *H03M 13/37* (2013.01); *H03M 13/13* (2013.01); *H03M 13/39* (2013.01)

(58) Field of Classification Search
  CPC ...... H03M 13/03; H03M 13/13; H03M 13/39; H03M 13/37; H03M 13/45
  See application file for complete search history.

(56) References Cited

PUBLICATIONS

Voloshynovskiy et al., Soft content fingerprinting with bit polarization based on sign-magnitude decomposition, Oct. 2015, IEEE Trans. on Info. Forensics and security, vol. 10, No. 10, pp. 2033 to 2047.*

Dong-Min Shin et al., Design of length compatible polar codes based on the Reduction of Polarizing matrices, Jul. 2013, IEEE Trans. on Comm., vol. 61, No. 7, pp. 2592-2599.*

Shuanghong sun, Improve the usability of Polar codes: code construction, performance enhancement and configurable hardware, 2017, (retrived from google Dec. 20, 2019), pp. 1 to 135.*

Camille Leroux, Ido Tal, Alexander Vardy, Warren J. Gross, "Hardware architectures for successive cancellation decoding of polar codes", pp. 1665-1668, IEEE, USA, 2011.

* cited by examiner

*Primary Examiner* — Shelly A Chase
(74) *Attorney, Agent, or Firm* — Winston Hsu

(57) ABSTRACT

A method for performing polar decoding with aid of notation transformation and associated polar decoder are provided. The method includes: transforming input signals from a 2's complement notation to a signed magnitude notation to generate transformed input signals, wherein during the polar decoding, a plurality of first sub-operations and a plurality of second sub-operations are performed to generate decoding results of the transformed input signals; performing a first sign processing to generate a sign result of a first sub-operation within the plurality of first sub-operations; performing a first magnitude processing to generate a magnitude result of the first sub-operation within the plurality of first sub-operations; performing a second sign processing to generate a sign result of a second sub-operation within the plurality of second sub-operations; and performing a second magnitude processing to generate a magnitude result of the second sub-operation within the plurality of second sub-operations.

16 Claims, 7 Drawing Sheets

METHOD FOR PERFORMING POLAR DECODING WITH AID OF NOTATION TRANSFORMATION AND ASSOCIATED POLAR DECODER

BACKGROUND

The present invention is related to polar decoding, more particularly, to a method for performing polar decoding with aid of notation transformation and associated polar decoder.

Recently, polar code has been chosen for utilization on 5G channels coding, however, it is essentially hard to reduce hardware complexity of polar decoders due to intrinsic latency of polar decoding. More specifically, hardware implementation of the polar decoders may require large circuit area and power consumption to achieve short decoding latency. On the other hand, additional power and hardware source may greatly increase along with high speed operations.

In a polar decoding procedure, some key operations may be repeated multiple times, which means sub-circuits for executing these operations may occupy a big portion of circuit area. In order to meet speed requirement of polar decoding, advanced wafer fabrication, high operating voltage, or extremely complicated circuit structure may be utilized for design of the aforementioned sub-circuits, however, some problems such as greatly increased power consumption, greatly increased circuit area, etc. may be introduced. Thus, a novel method and associated architecture are needed for solving the problems without introducing any side effect or in a way that introduces less side effect.

SUMMARY

An objective of the present invention is to provide a method for performing polar decoding with aid of notation transformation and associated polar decoder, to solve the aforementioned problems.

Another objective of the present invention is to provide a method for performing polar decoding with aid of notation transformation and associated polar decoder, to improve overall performance of a communications device without introducing any side effect or in a way that introduces less side effect.

At least one embodiment of the present invention provides a method for performing polar decoding with aid of notation transformation. The method comprises: transforming input signals from a 2's complement notation to a signed magnitude notation to generate transformed input signals, wherein during the polar decoding, a plurality of first sub-operations and a plurality of second sub-operations of the polar decoding are performed to generate decoding results of the transformed input signals; according to a first input signal and a second input signal, performing first sign processing to generate a sign result of a first sub-operation within the plurality of first sub-operations; according to the first input signal and the second input signal, performing first magnitude processing to generate a magnitude result of the first sub-operation within the plurality of first sub-operations; according to a single bit signal, a third input signal and a fourth input signal, performing second sign processing to generate a sign result of a second sub-operation within the plurality of second sub-operations; and according to the single bit signal, the third input signal and the fourth input signal, performing second magnitude processing to generate a magnitude result of the second sub-operation within the plurality of second sub-operations; wherein the first input signal, the second input signal, the third input signal and the fourth input signal are selected from the transformed signals or derivatives thereof, and the single bit signal is a decoding result within the decoding results during the polar decoding.

In addition to the above method, the present invention also provides a polar decoder, and the polar decoder comprises a plurality of first sub-operation modules and a plurality of second sub-operation modules. The plurality of first sub-operation modules are arranged to perform a plurality of first sub-operations, wherein each of the plurality of first sub-operation modules comprises a first sign processing circuit and a first magnitude processing circuit, the first sign processing circuit is arranged to perform first sign processing to generate a sign result of a first sub-operation according to a first input signal and a second input signal, and the first magnitude processing circuit is arranged to perform first magnitude processing to generate a magnitude result of the first sub-operation according to the first input signal and the second input signal. The plurality of second sub-operation modules are arranged to perform a plurality of second sub-operations, wherein each of the plurality of second sub-operation modules comprises a second sign processing circuit and a second magnitude processing circuit, the second sign processing circuit is arranged to perform second sign processing to generate a sign result of a second sub-operation according to a single bit signal, a third input signal and a fourth input signal, and the second magnitude processing circuit, arranged to perform second magnitude processing to generate a magnitude result of the second sub-operation according to the single bit signal, the third input signal and the fourth input signal. Additionally, the first input signal, the second input signal, the third input signal and the fourth input signal are signals with signed magnitude notations, and the single bit signal is a decoding result during the polar decoding.

The method and the polar decoder of the present invention can reduce overall circuit complexity with aid of notation transformation, and thereby improve overall performance of the communications device. In addition, implementing according to the aforementioned embodiments of the present invention will not greatly increase additional costs. Therefore, problems of the related arts can be solved without greatly increasing the overall cost. In comparison with the related art, the present invention can improve overall performance of the polar decoders without introducing side effects or in a way that introduces less side effects.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
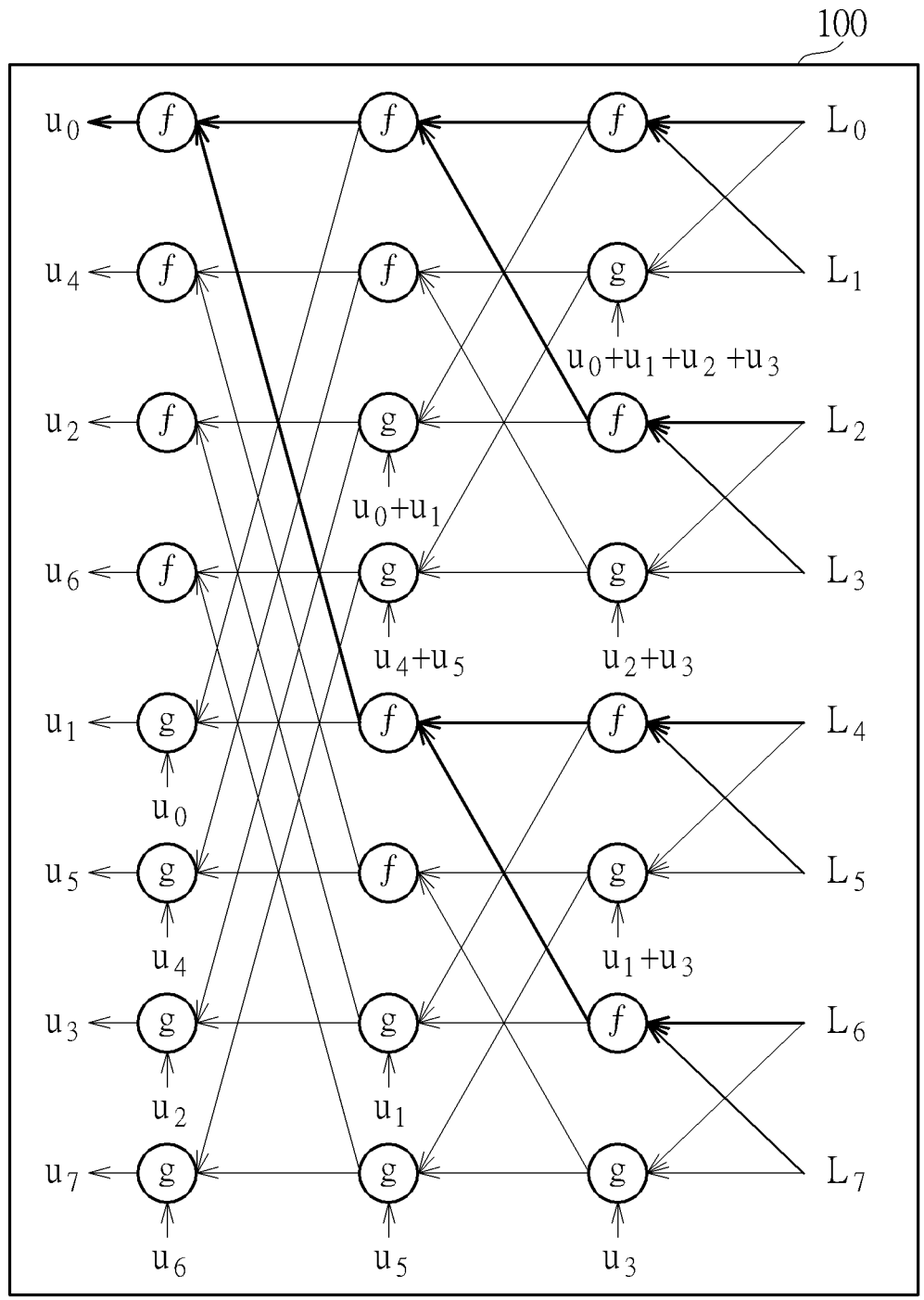
FIG. 1 is a diagram illustrating a polar decoder.

For better comprehension, a paper titled "Hardware architectures for successive cancellation decoding of polar codes" and proposed by CAMILLE LEROUX, IDO TAL, ALEXANDER VARDY, and WARREN J. GROSS is incorporated herein by reference. A successive cancellation (SC) decoder which has a structure resembling a Fast Fourier Transform (FFT) can be efficiently implemented as shown in FIG. 1, which is a diagram illustrating a polar decoder 100. Please note that, signals $\{L_0, L_1, L_2, L_3, L_4, L_5, L_6, L_7\}$ may be input signals of the polar decoder 100, signals $\{u_0, u_1, u_2, u_3, u_4, u_5, u_6, u_7\}$ may be decoding results during polar decoding, where each of the signals $\{u_0, u_1, u_2, u_3, u_4, u_5, u_5, u_7\}$ may be either 0 or 1.

Key function blocks such as first sub-operation modules (which are labeled "f" in FIG. 1, for brevity) and second sub-operation modules (which are labeled "g" in FIG. 1, for brevity), are arranged to perform f-function and g-function, respectively, where operations of f-function and g-function may be expressed as follows:

$$f(L_a, L_b) = \text{sign}(L_a) \times \text{sign}(L_a) \times \min(|L_a|, |L_b|)$$

$$g_{u_s}(L_a, L_b) = L_a \times (-1)^{u_s} + L_b$$

where $L_a$ and $L_b$ may represent input signals of these operations, sign ($L_a$) and sign($L_b$) may represent sign signals of signals $L_a$ and $L_b$, respectively, $\min(|L_a|, |L_b|)$ may represent the minimum of magnitudes (or absolute values) of the signals $L_a$ and $L_b$, and signal $u_s$ may be either 0 or 1. As shown in FIG. 1, the first sub-operation modules and the second sub-operation modules are repeatedly implemented in the polar decoder 100, which may greatly affect overall performance of the polar decoder 100.

Figure 2:
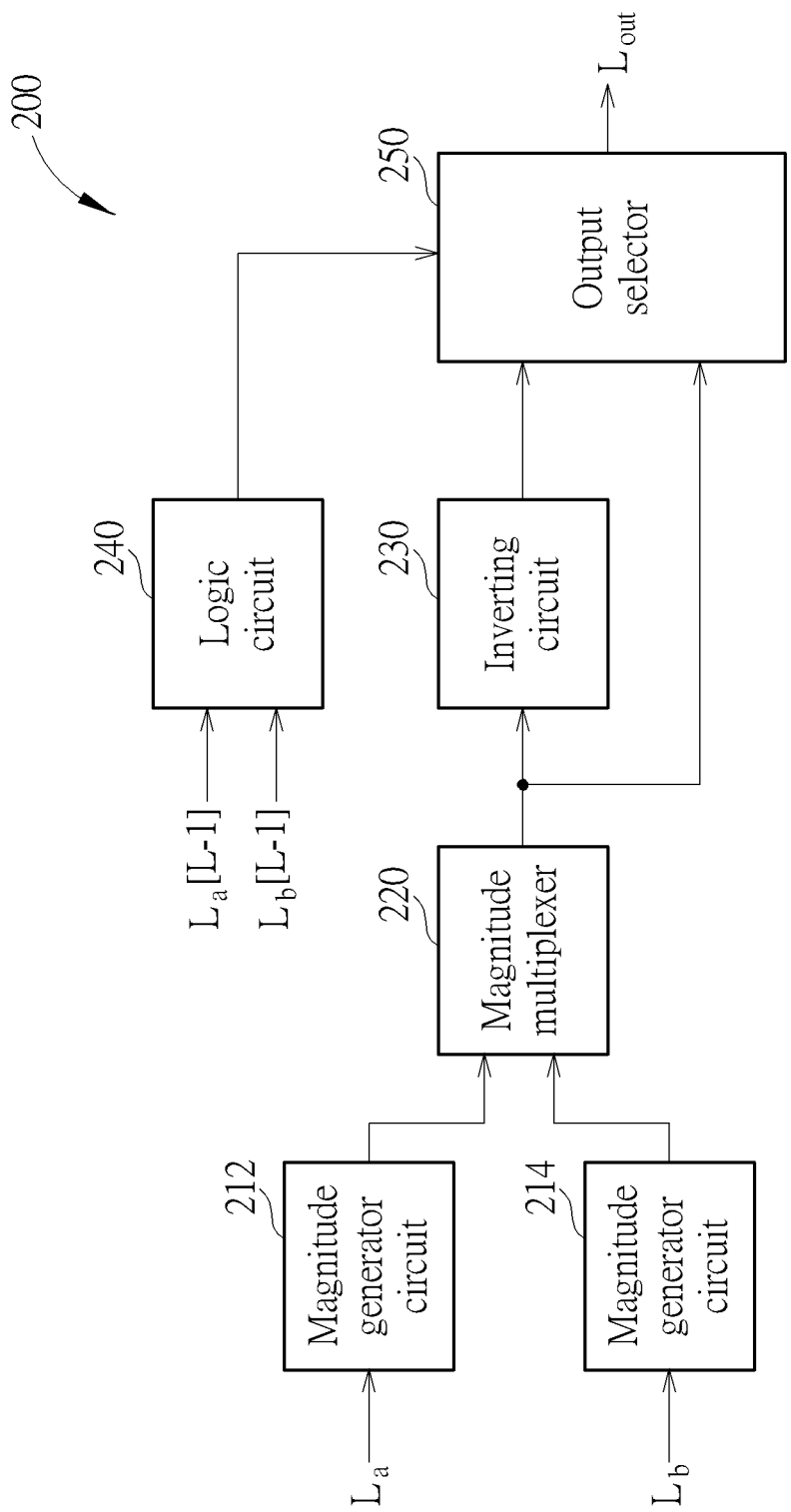
FIG. 2 is a diagram illustrating a first sub-operation module.
Figure 3:
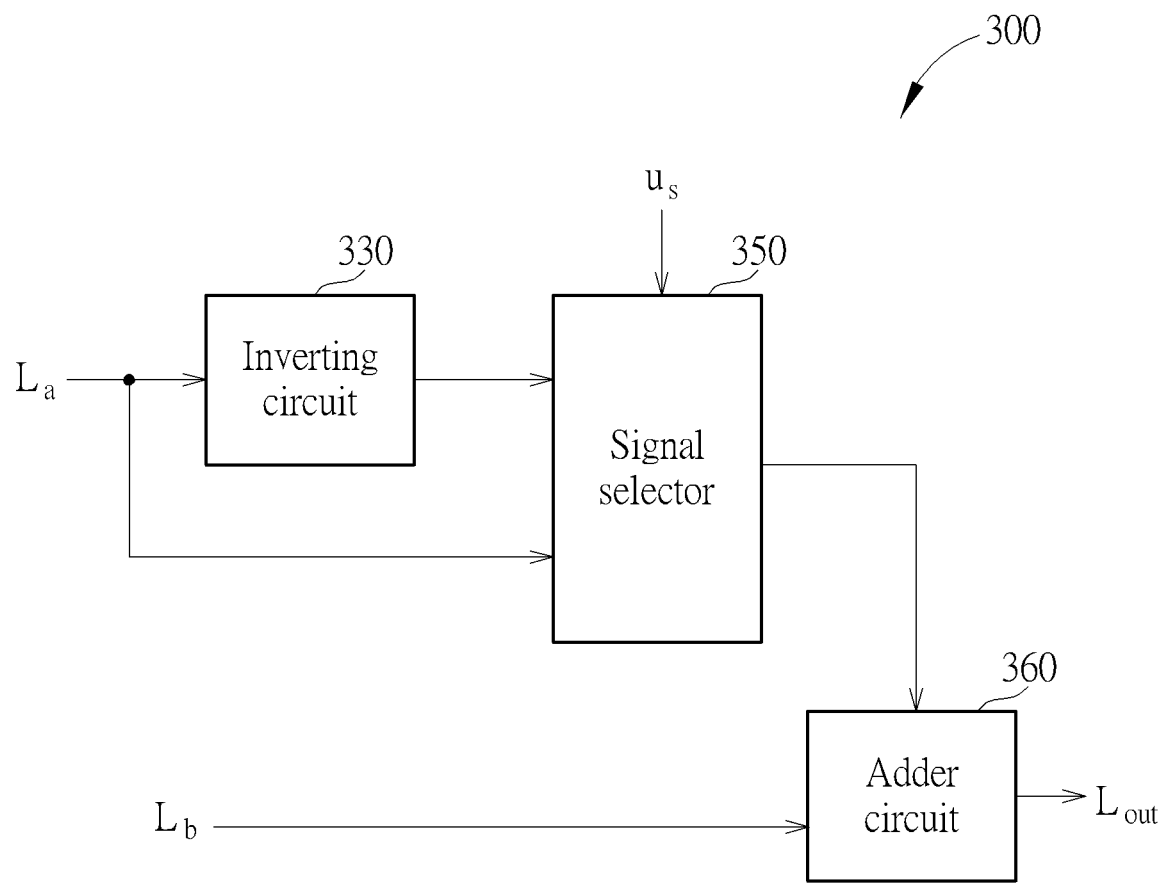
FIG. 3 is a diagram illustrating a second sub-operation module.

According to some embodiments, 2's complement notation may be used in digital signal processing, but the present invention is not limited thereto. FIG. 2 and FIG. 3 respectively illustrate a first sub-operation module (such as an f-operation module 200) and a second sub-operation module (such as a g-operation module 300) according to an embodiment of the present invention.

As shown in FIG. 2, the f-operation module 200 may comprise: a magnitude generator circuit 212 and a magnitude generator circuit 214, arranged to generate magnitudes (or absolute values) of the signals $L_a$ and $L_b$, respectively; a magnitude multiplexer 220, arranged to select a signal having smaller magnitude within the magnitudes of the signals $L_a$ and $L_b$; an inverting circuit 230, arranged to generate a negative signal of the signal selected by the magnitude multiplexer 220; a logic circuit 240, arranged to generate an exclusive-or (XOR) output signal of a most significant bit (MSB) of the signal $L_a$ and an MSB of the signal $L_b$, to be a control signal; and a output selector 250, arranged to select one of signal passing through the inverting circuit 230 and signal without passing through the inverting circuit 230 according to the control signal generated by the logic circuit 240, to be an output signal (such as signal $L_{out}$) of the f-operation module 200. Provided that the signals $L_{out}$, $L_a$ and $L_b$ are "L" bits signals, where the symbol "L" is positive integer, therefore, $L_a[L-1]$ and $L_b[L-1]$ may represent the MSBs of the signals $L_a$ and $L_b$, respectively.

As shown in FIG. 3, the g-operation module 300 may comprise: an inverting circuit 330, arranged to generate a negative signal of the signal $L_a$; a signal selector 350, arranged to select one of the signal $L_a$ and the negative signal of the signal $L_a$ according to a signal $u_s$ (which may be either 0 or 1); and an adder circuit 360, arranged to add the signal $L_b$ and the signal selected by the signal selector 350, to generate an output signal of the g-operation module 300.

Please note that, the f-operation module 200 is formed by 4-stage components (such as the magnitude generator circuit 212/214, the magnitude multiplexer 220, the inverting circuit 230, and the output selector 250) as shown in FIG. 2 (similarly, the g-operation module 300 is formed by 3-stage components). When operating speed of the polar decoder 100 increases, the f-operation module 200 may be required to have specific design on the components within the f-operation module 200, to meet speed requirement, which may need more hardware and associated area. On the other hand, the operating speed of the f-operation module 200 may be a bottleneck, which may limit overall performance of the polar decoder 100.

According to some embodiments, a method for performing polar decoding with aid of notation transformation and associated polar decoders with reduced circuit complexity are further provided to increase the operating speed of the f-operation module, in order to enhance the overall performance. For better comprehension, the method may be described by ways of examples of operations of the polar decoders, but the present invention is not limited thereto.

Figure 4:
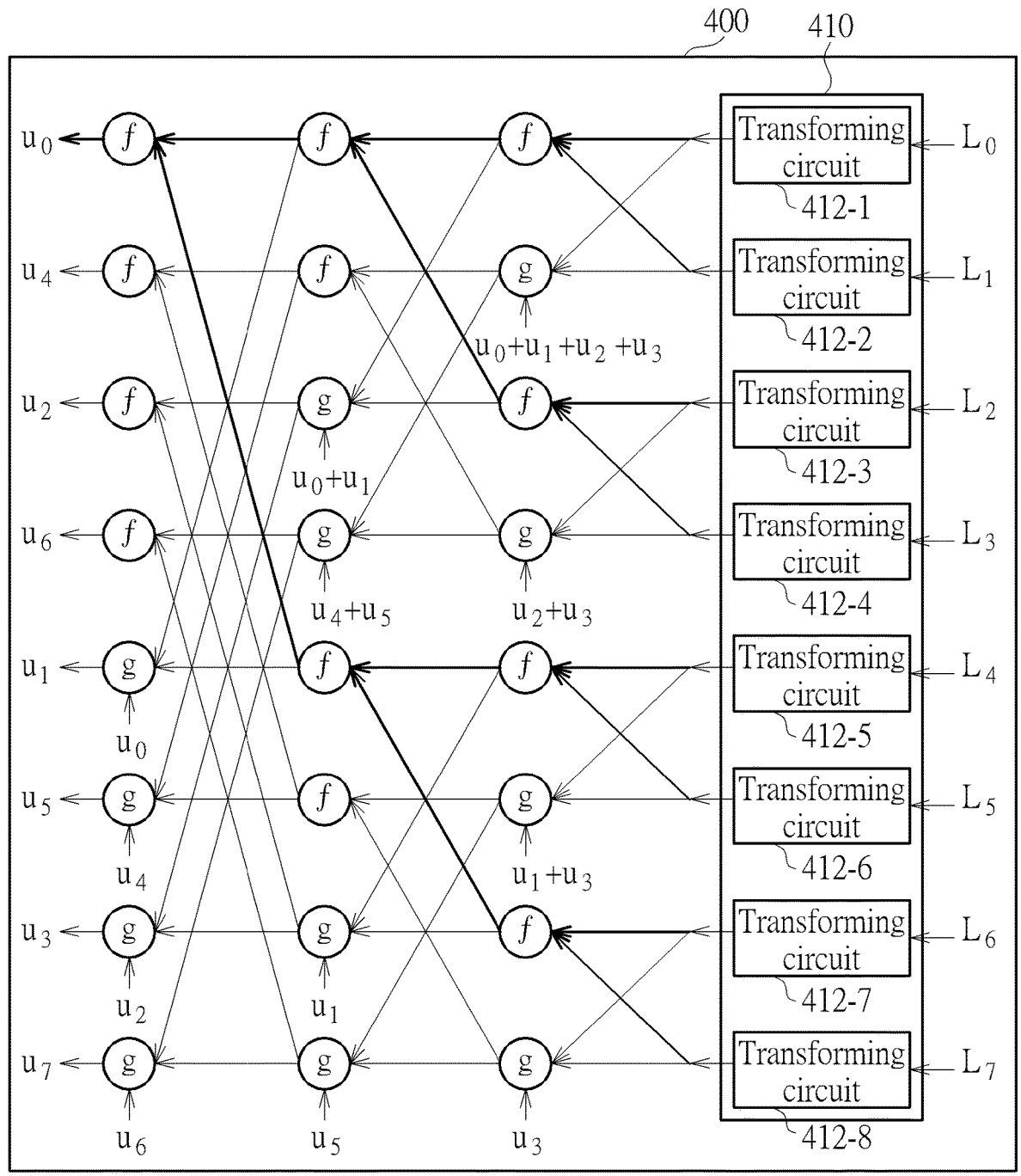
FIG. 4 is a diagram illustrating a polar decoder according to an embodiment of the present invention.

FIG. 4 is a diagram illustrating a polar decoder 400 according to an embodiment of the present invention. The polar decoder 400 may comprise a transforming module 410 which may comprise multiple transforming circuits such as transforming circuits 412-1, 412-2, 412-3, 412-4, 412-5, 412-6, 412-7 and 412-8, and may further comprise a plurality of first sub-operation modules (labeled "f" in FIG. 4) and a plurality of second sub-operation modules (labeled "g" in FIG. 4). For example, each of the transforming circuits 412-1, 412-2, 412-3, 412-4, 412-5, 412-6, 412-7 and 412-8 is arranged to transform a input signal from a 2's complement notation to a signed magnitude notation to generate a transformed input signal, that is, the subsequent decoding procedure is performed on signals with the signed magnitude notation, but the present invention is not limited thereto. Please note that, the architecture of the polar decoder 400 is for illustrative purposes only, and is not meant to be a limitation of the present invention. The aforementioned transforming circuits should be well known by those skilled in this art, related detail is omitted here, for brevity.

In this embodiment, the plurality of first sub-operation modules (labeled "f" in FIG. 4) are arranged to perform a plurality of first sub-operations (such as the operations of the f-function), and the plurality of second sub-operation modules (labeled "g" in FIG. 4) are arranged to perform a plurality of second sub-operations (such as the operations of the g-function), but the present invention is not limited thereto. Some implementation details of each of the plurality of first sub-operation modules and each of the plurality of second sub-operation modules may be described as follows.

TABLE 1

| Binary | 2's complement | Signed magnitude |
|---|---|---|
| 111 | −1 | −3 |
| 110 | −2 | −2 |
| 101 | −3 | −1 |
| 100 | −4 | −0 |
| 011 | +3 | +3 |
| 010 | +2 | +2 |
| 001 | +1 | +1 |
| 000 | 0 | +0 |

Table 1 illustrates a mapping table between respective 3-bit binary numbers, corresponding values regarding the 2's complement notation and corresponding values regarding the signed magnitude notation. For example, for the 2's complement notation, binary number "111" represents value "−1", however, for the signed magnitude notation, the binary number 111 represents "−3". Please note that, for a specific value (such as "−3"), it may be represented by the binary number "101" with the 2's complement notation, and the transforming circuit may transform the binary number "101" with the 2's complement notation to the binary number "111" with the signed magnitude notation. For better comprehension, Table 1 may be re-arranged to generate the following table.

TABLE 2

| Value | 2's complement | Signed magnitude |
|---|---|---|
| +3 | 011 | 011 |
| +2 | 010 | 010 |
| +1 | 001 | 001 |
| 0 | 000 | 000/100 |
| −1 | 111 | 101 |
| −2 | 110 | 110 |
| −3 | 101 | 111 |
| −4 | 100 | — |

Table 2 illustrates a mapping table between the binary numbers with the 2's complement notation and the binary numbers with the signed magnitude notation, where the first column represents respective values, the second column represents corresponding binary numbers with the 2's complement, and the last column represents corresponding binary numbers with the signed magnitude. Please note that, for the signed magnitude notation, both of the binary number "000" and the binary number "100" represent the value "0", additionally, the value "−4" cannot be represented by the 3-bit binary signed magnitude notation.

Please note that, a MSB of a binary input signal with signed magnitude notation represents a sign signal of the input signal, and the rest of bits of the input signal represent a magnitude signal of the input signal. For example, the value "+3" may be represented by the binary number "011", where the MSB "0" may indicate that the value is a positive value, and the rest of bits "11" may indicate that the magnitude of the value is "3". For another example, the value "−1" may be represented by the binary number "101", where the MSB "1" may indicate that the value is a negative value, and the rest of bits "01" may indicate that the magnitude of the value is "1".

Figure 5:
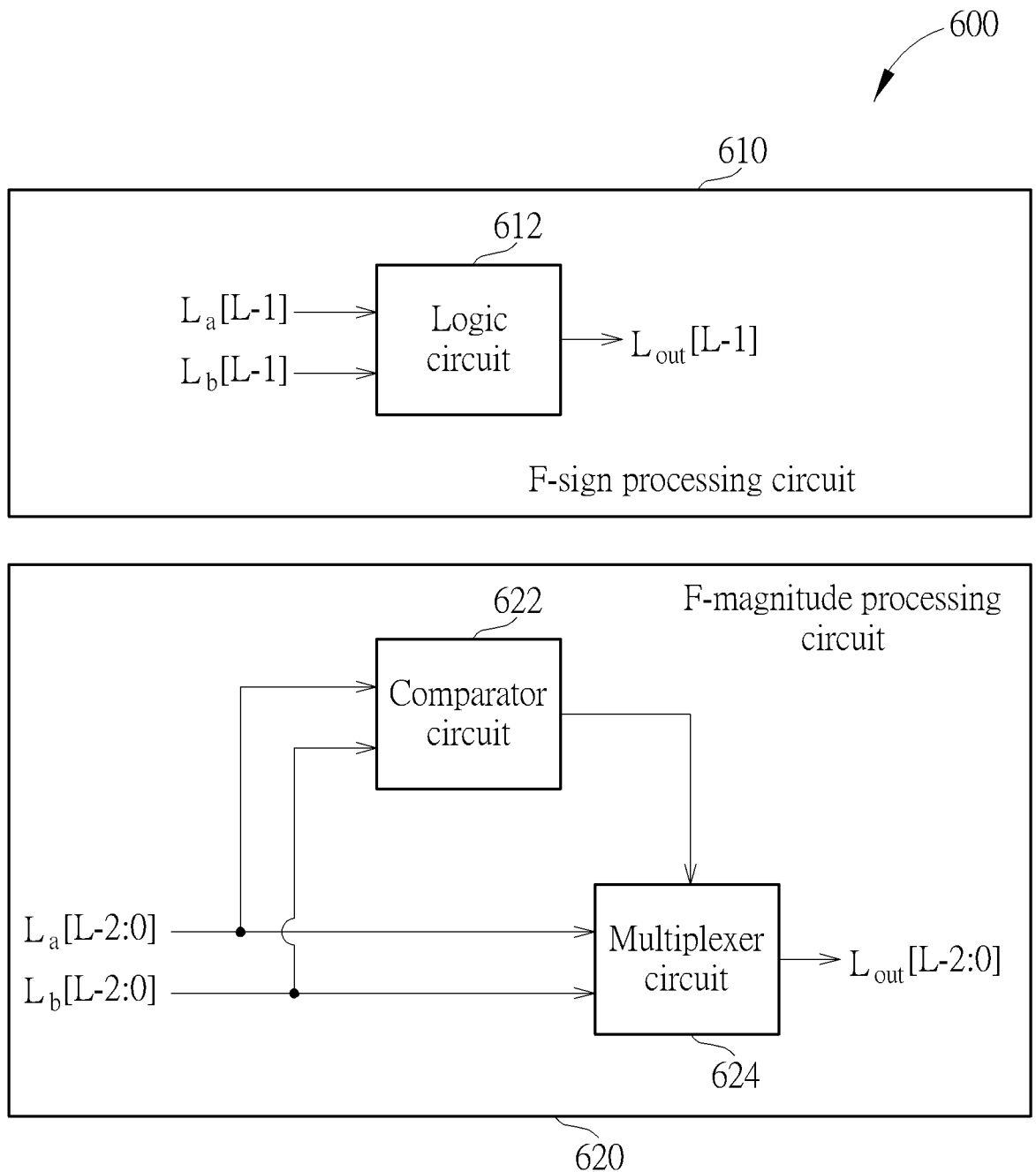
FIG. 5 is a diagram illustrating a first sub-operation module according to an embodiment of the present invention.

In an embodiment, each of the plurality of first sub-operation modules shown in FIG. 4 may be implemented as architecture shown in FIG. 5, which is a diagram illustrating a first sub-operation module such as f-operation module 600 according to an embodiment of the present invention. The f-operation module 600 may comprise a first sign processing circuit such as F-sign processing circuit 610, and a first magnitude processing circuit such as F-magnitude processing circuit 620, where the F-sign processing circuit 610 may comprise a logic circuit 612, and the F-magnitude processing circuit 620 may comprise a comparator circuit 622 and a multiplexer circuit 624.

According to this embodiment, the F-sign processing circuit 610 may be arranged to perform first sign processing to generate a sign result (e.g. $L_{out}[L-1]$) of the f-function according to a first input signal (e.g. signal $L_a$) and a second input signal (e.g. signal $L_b$), and the F-magnitude processing circuit 620 may be arranged to perform first magnitude processing to generate a magnitude result (e.g. $L_{out}[L-2:0]$) of the f-function according to signals $L_a$ and $L_b$, but the present invention is not limited thereto. Provided that the signals $L_{out}$, $L_a$ and $L_b$ are "L" bits signals, where the symbol "L" is a positive integer, therefore, $L_{out}[L-1]$, $L_a[L-1]$ and $L_b[L-1]$ may represent the MSBs of the signals $L_{out}$, $L_a$ and $L_b$, respectively, and, $L_{out}[L-2:0]$, $L_a[L-2:0]$ and $L_b[L-2:0]$ may represent the magnitudes of the signals $L_{out}$, $L_a$ and $L_b$.

In addition, the logic circuit 612 may generate an exclusive-or output signal of $L_a[L-1]$ and $L_b[L-1]$, to be the sign result of the f-function. The comparator circuit 622 may generate a comparison result according to whether $L_a[L-2:0]$ is greater than $L_b[L-2:0]$. The multiplexer circuit 624 may select one of $L_a[L-2:0]$ and $L_b[L-2:0]$ according to the comparison result, to be the magnitude result of the f-function, but the present invention is not limited thereto.

Figure 6:
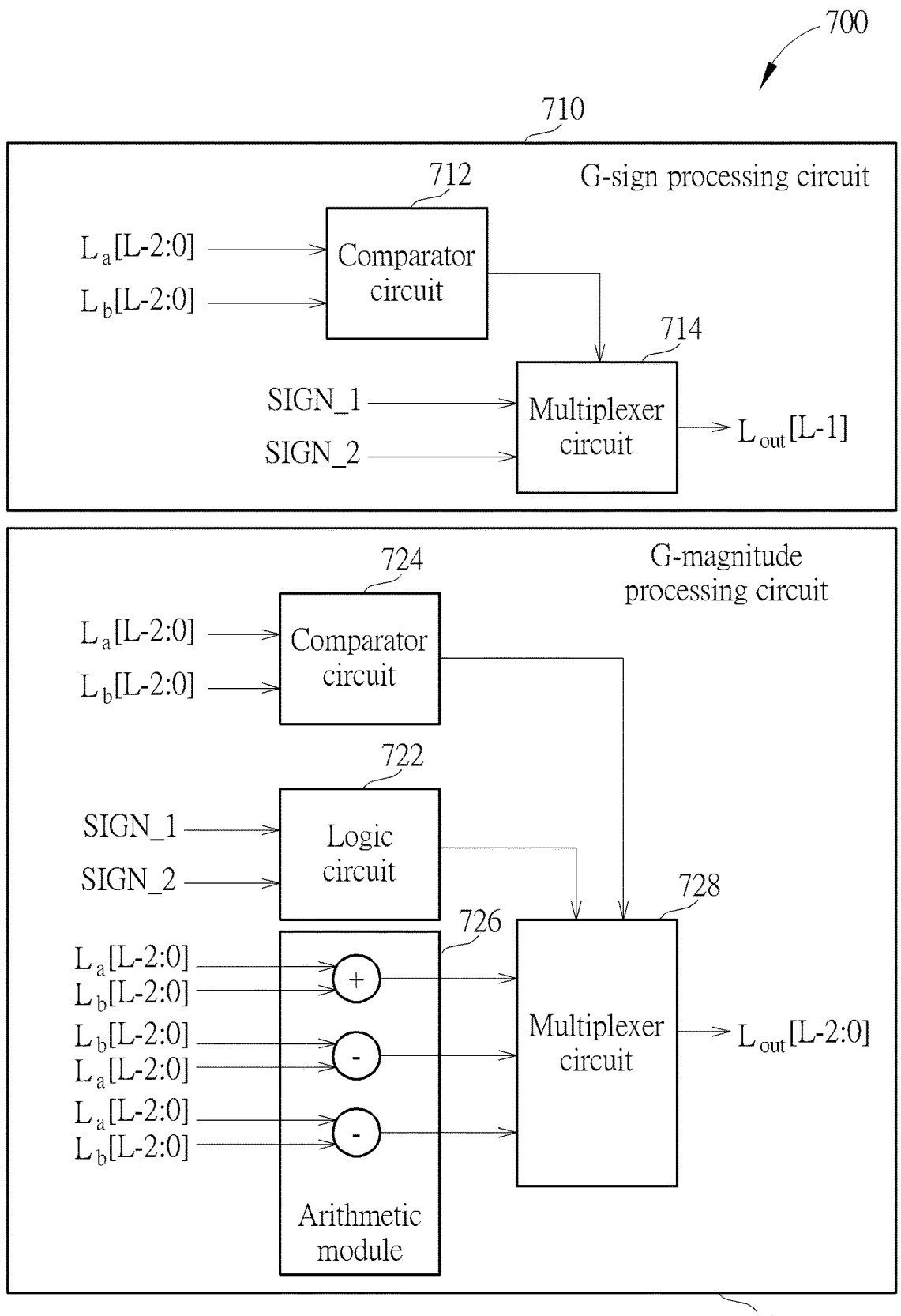
FIG. 6 is a diagram illustrating a second sub-operation module according to an embodiment of the present invention.

FIG. 6 is a diagram illustrating a second sub-operation module (such as g-operation module 700) according to an embodiment of the present invention. In this embodiment, the g-operation module 700 may comprise a second sign processing circuit such as G-sign processing circuit 710, and a second magnitude processing circuit such as G-magnitude processing circuit 720, where the G-sign processing circuit 710 may comprise a comparator circuit 712 and a multiplexer circuit 714, and the G-magnitude processing circuit 720 may comprise a logic circuit 722, a comparator circuit 724, an arithmetic module 726 and a multiplexer circuit 728.

According to this embodiment, the G-sign processing circuit 710 may be arranged to perform second sign processing to generate a sign result (e.g. $L_{out}[L-1]$) of the g-function according to a single bit signal (e.g. signal $u_s$, which may be either 0 or 1), a third input signal (e.g. signal $L_a$) and a fourth input signal (e.g. signal $L_b$), and the G-magnitude processing circuit 720 may be arranged to perform second magnitude processing to generate a magnitude result (e.g. $L_{out}[L-2:0]$) of the g-function according to the signals $u_s$, $L_a$ and $L_b$, but the present invention is not limited thereto. Provided that the signals $L_{out}$, $L_a$ and $L_b$ are "L" bits signals, where the symbol "L" is positive integer, therefore, $L_{out}[L-1]$, $L_a[L-1]$ and $L_b[L-1]$ may represent the MSBs of the signals $L_{out}$, $L_a$ and $L_b$, respectively, and, $L_{out}[L-2:0]$, $L_a[L-2:0]$ and $L_b[L-2:0]$ may represent the magnitudes of the signals $L_{out}$, $L_a$ and $L_b$.

In an embodiment, the comparator circuit 712 may generate a comparison result according to whether $L_a[L-2:0]$ is greater than $L_b[L-2:0]$. The multiplexer circuit 714 may select one of a first sign signal (such as signal SIGN_1) and a second sign signal (such as signal SIGN_2) according to the comparison result, to be the sign result of the g-function (e.g. $L_{out}[L-1]$), where the signal SIGN_1 is an exclusive-or output signal of signal $u_s$ and $L_a[L-1]$, and the signal SIGN_2 is $L_b[L-1]$, but the present invention is not limited thereto.

In addition, the logic circuit 722 may generate a first control signal according to the signal SIGN_1 and the signal SIGN_2, where the first control signal is an exclusive-or output signal of the signal SIGN land the signal SIGN_2. The comparator circuit 724 may generate a second control signal according to whether $L_a[L-2:0]$ is greater than $L_b[L-2:0]$. The arithmetic module 726 may generate a plurality of magnitude output signals according to $L_a[L-2:0]$ and $L_b[L-2:0]$. For example, the arithmetic module 726 may comprise multiple arithmetic circuits, and the multiple arithmetic circuits may be arranged to perform arithmetic operations of adding $L_a[L-2:0]$ and $L_b[L-2:0]$ (as illustrated with a circle having a symbol "+" therein), subtracting $L_b[L-2:0]$ from $L_a[L-2:0]$ (as illustrated with a circle having a symbol "−" therein), and subtracting $L_a[L-2:0]$ from $L_b[L-2:0]$ (as illustrated with a circle having a symbol "−" therein), respectively. The multiplexer circuit 728 may select one of the plurality of magnitude output signals according to the first control signal and the second control signal, to be the magnitude result of the g-function (e.g. $L_{out}[L-2:0]$), but the present invention is not limited thereto.

Figure 7:
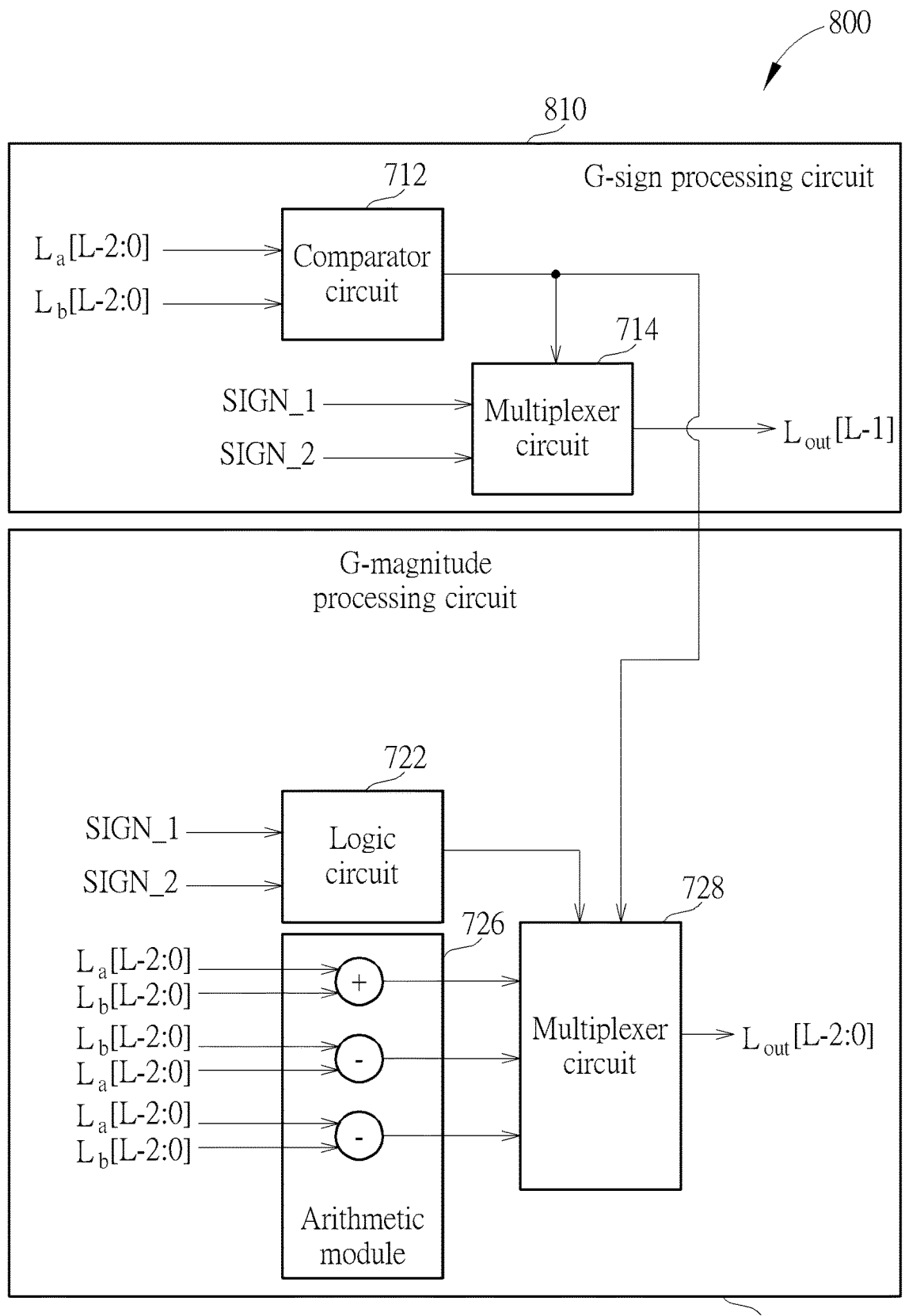
FIG. 7 is a diagram illustrating a second sub-operation module according to another embodiment of the present invention.

FIG. 7 is a diagram illustrating a second sub-operation module (such as g-operation module 800) according to another embodiment of the present invention. In this embodiment, the g-operation module 800 may comprise a second sign processing circuit such as G-sign processing circuit 810, and a second magnitude processing circuit such as G-magnitude processing circuit 820. Please note that, the architecture of the g-operation module 800 is similar to the architecture of the g-operation module 700 shown in FIG. 6, where the G-sign processing circuit 810 is exactly same as the G-sign processing circuit 710. The main difference between the G-magnitude processing circuit 820 and the G-magnitude processing circuit 720 is the comparator circuit 724, which is omitted in the G-magnitude processing circuit 820 since the G-magnitude processing circuit 820 may receive the output of the comparator circuit 712 and share the same hardware. As shown in FIG. 7, the multiplexer circuit 728 may select one of the plurality of magnitude output signals generated by the arithmetic module 726 according to a control signal generated by the logic circuit 722 and the comparison result generated by the comparator circuit 712, to be the magnitude result of the g-function (e.g. $L_{out}[L-2:0]$), but the present invention is not limited thereto. Since the associated details have been described in the aforementioned embodiments, similar descriptions are not repeated in detail here.

Please refer to FIG. 5 in conjunction with FIG. 2, in comparison with the architecture of the f-operation module 200 shown in FIG. 2, circuit complexity of the f-operation module 600 shown in FIG. 5 can be greatly reduced, where a 4-stage architecture is changed to a 2-stage architecture. Although the circuit complexity of the g-operation module 700 (or the g-operation module 800) may increase in comparison with that of the g-operation module 300, overall circuit complexity of the polar decoder 400 may be reduced. Thus, the method and associated polar decoder of the present invention can solve problems of related art (such as that regarding hardware circuit area, power consumption and speed consideration) without greatly increasing additional costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing polar decoding with aid of notation transformation, comprising:
    transforming input signals from a 2's complement notation to a signed magnitude notation to generate transformed input signals, wherein during the polar decoding, a plurality of first sub-operations and a plurality of second sub-operations of the polar decoding are performed to generate decoding results of the transformed input signals;
    according to a first input signal and a second input signal, performing first sign processing to generate a sign result of a first sub-operation within the plurality of first sub-operations;
    according to the first input signal and the second input signal, performing first magnitude processing to generate a magnitude result of the first sub-operation within the plurality of first sub-operations;
    according to a single bit signal, a third input signal and a fourth input signal, performing second sign processing to generate a sign result of a second sub-operation within the plurality of second sub-operations; and
    according to the single bit signal, the third input signal and the fourth input signal, performing second magnitude processing to generate a magnitude result of the second sub-operation within the plurality of second sub-operations;
    wherein the first input signal, the second input signal, the third input signal and the fourth input signal are selected from the transformed signals or derivatives thereof, and the single bit signal is a decoding result within the decoding results during the polar decoding.

2. The method of claim 1, wherein the step of performing the first sign processing to generate the sign result of the first sub-operation within the plurality of first sub-operations further comprises:
    performing a logic operation according to respective most significant bits (MSBs) of the first input signal and the second input signal, to generate an exclusive-or output signal of the MSB of the first input signal and the MSB of the second input signal, to be the sign result of the first sub-operation.

3. The method of claim 1, wherein the step of performing the first magnitude processing to generate the magnitude result of the first sub-operation within the plurality of first sub-operations further comprises:
    performing a comparison operation according to the magnitude of the first input signal and the magnitude of the second input signal, to generate a comparison result, wherein the comparison result indicates whether the magnitude of the first input signal is greater than the magnitude of the second input signal; and
    according to the comparison result, selecting one of the magnitude of the first input signal and the magnitude of the second input signal, to be the magnitude result of the first sub-operation.

4. The method of claim 1, wherein the step of performing the second sign processing to generate the sign result of the second sub-operation within the plurality of second sub-operations further comprises:

performing a comparison operation according to the magnitude of the third input signal and the magnitude of the fourth input signal, to generate a comparison result, wherein the comparison result indicates whether the magnitude of the third input signal is greater than the magnitude of the fourth input signal; and according to the comparison result, selecting one of a first sign signal and a second sign signal, to be the sign result of the second sub-operation;

wherein the first sign signal is an exclusive-or output signal of the single bit signal and a most significant bit (MSB) of the third input signal, and the second sign signal is an MSB of the fourth input signal.

5. The method of claim 1, wherein the step of performing the second magnitude processing to generate the magnitude result of the second sub-operation within the plurality of second sub-operations further comprises:

performing an exclusive-or operation according to a first sign signal and a second sign signal, to generate a first control signal, wherein the first sign signal is an exclusive-or output signal of the single bit signal and a most significant bit (MSB) of the third input signal, the second sign signal is an MSB of the fourth input signal, and the first control signal is an exclusive-or output signal of the first sign signal and the second sign signal;

performing a comparison operation according to the magnitude of the third input signal and the magnitude of the fourth input signal, to generate a second control signal, wherein the second control signal indicates whether the magnitude of the third input signal is greater than the magnitude of the fourth input signal;

performing arithmetic operations according to the magnitude of the third input signal and the magnitude of the fourth input signal, to generate a plurality of magnitude output signals; and according to the first control signal and the second control signal, selecting one of the plurality of magnitude output signals, to be the magnitude result of the second sub-operation.

6. The method of claim 5, wherein the step of performing the arithmetic operations according to the magnitude of the third input signal and the magnitude of the fourth input signal to generate the plurality of magnitude output signals further comprises:

adding the magnitude of the third input signal and the magnitude of the fourth input signal;

subtracting the magnitude of the fourth input signal from the magnitude of the fourth input signal; and subtracting the magnitude of the third input signal from the magnitude of the fourth input signal.

7. The method of claim 4, wherein the step of performing the second magnitude processing to generate the magnitude result of the second sub-operation within the plurality of second sub-operations further comprises:

performing an exclusive-or operation according to the first sign signal and the second sign signal, to generate a control signal, wherein the control signal is an exclusive-or output signal of the first sign signal and the second sign signal;

performing arithmetic operations according to the magnitude of the third input signal and the magnitude of the fourth input signal, to generate a plurality of magnitude output signals; and according to the control signal and the comparison result, selecting one of the plurality of magnitude output signals, to be the magnitude result of the second sub-operation.

8. The method of claim 7, wherein the step of performing the arithmetic operations according to the magnitude of the third input signal and the magnitude of the fourth input signal to generating the plurality of magnitude output signals further comprises:

adding the magnitude of the third input signal and the magnitude of the fourth input signal;

subtracting the magnitude of the fourth input signal from the magnitude of the fourth input signal; and subtracting the magnitude of the third input signal from the magnitude of the fourth input signal.

9. A polar decoder, comprising:

a plurality of first sub-operation modules, arranged to perform a plurality of first sub-operations, wherein each of the plurality of first sub-operation modules comprises:

a first sign processing circuit, arranged to perform first sign processing to generate a sign result of a first sub-operation according to a first input signal and a second input signal; and a first magnitude processing circuit, arranged to perform first magnitude processing to generate a magnitude result of the first sub-operation according to the first input signal and the second input signal; and a plurality of second sub-operation modules, arranged to perform a plurality of second sub-operations, wherein each of the plurality of second sub-operation modules comprises:

a second sign processing circuit, arranged to perform second sign processing to generate a sign result of a second sub-operation according to a single bit signal, a third input signal and a fourth input signal; and a second magnitude processing circuit, arranged to perform second magnitude processing to generate a magnitude result of the second sub-operation according to the single bit signal, the third input signal and the fourth input signal;

wherein the first input signal, the second input signal, the third input signal and the fourth input signal are signals with signed magnitude notations, and the single bit signal is a decoding result during the polar decoding.

10. The polar decoder of claim 9, wherein the first sign processing circuit further comprises:

a logic circuit, arranged to generate an exclusive-or output signal of a most significant bit (MSB) of the first input signal and an MSB of the second input signal.

11. The polar decoder of claim 9, wherein the first magnitude processing circuit further comprises:

a comparator circuit, arranged to generate a comparison result according to whether the magnitude of the first input signal is greater than the magnitude of the second input signal; and a multiplexer circuit, arranged to select one of the magnitude of the first input signal and the magnitude of the second input signal according to the comparison result, to be the magnitude result of the first sub-operation.

12. The polar decoder of claim 9, wherein the second sign processing circuit further comprises:

a comparator circuit, arranged to generate a comparison result according to whether the magnitude of the third input signal is greater than the magnitude of the fourth input signal; and a multiplexer circuit, arranged to select one of a first sign signal and a second sign signal according to the comparison result, to be the sign result of the second sub-operation;

wherein the first sign signal is an exclusive-or output signal of the single bit signal and a most significant bit (MSB) of the third input signal, and the second sign signal is an MSB of the fourth input signal.

13. The polar decoder of claim 9, wherein the second magnitude processing circuit further comprises:
   a logic circuit, arranged to generate a first control signal according to a first sign signal and a second sign signal, wherein the first sign signal is an exclusive-or output signal of the single bit signal and a most significant bit (MSB) of the third input signal, the second sign signal is an MSB of the fourth input signal, and the first control signal is an exclusive-or output signal of the first sign signal and the second sign signal;
   a comparator circuit, arranged to generate a second control signal according to whether the magnitude of the third input signal is greater than the magnitude of the fourth input signal;
   an arithmetic module, arranged to generate a plurality of magnitude output signals according to the magnitude of the third input signal and the magnitude of the fourth input signal; and
   a multiplexer circuit, arranged to select one of the plurality of magnitude output signals according to the first control signal and the second control signal, to be the magnitude result of the second sub-operation.

14. The polar decoder of claim 13, wherein the arithmetic module further comprises:
   multiple arithmetic circuits, arranged to perform arithmetic operations of adding the magnitude of the third input signal and the magnitude of the fourth input signal, subtracting the magnitude of the fourth input signal from the magnitude of the fourth input signal, and subtracting the magnitude of the third input signal from the magnitude of the fourth input signal, respectively.

15. The polar decoder of claim 12, wherein the second magnitude processing circuit further comprises:
   a logic circuit, arranged to generate a control signal according to the first sign signal and the second sign signal, wherein the control signal is an exclusive-or output signal of the first sign signal and the second sign signal;
   an arithmetic module, arranged to generate a plurality of magnitude output signals according to the magnitude of the third input signal and the magnitude of the fourth input signal; and
   a multiplexer circuit, arranged to select one of the plurality of magnitude output signals according to the control signal and the comparison result, to be the magnitude result of the second sub-operation.

16. The polar decoder of claim 15, wherein the arithmetic module further comprises:
   multiple numerical operation circuits, arranged to perform arithmetic operations of adding the magnitude of the third input signal and the magnitude of the fourth input signal, subtracting the magnitude of the fourth input signal from the magnitude of the fourth input signal, and subtracting the magnitude of the third input signal from the magnitude of the fourth input signal, respectively.

* * * * *